United States Patent [19]

Tsuchiya

[11] Patent Number: 5,336,901
[45] Date of Patent: Aug. 9, 1994

[54] COMPOSITE SEMICONDUCTOR STRUCTURE FOR REDUCING SCATTERING OF CARRIERS BY OPTICAL PHONONS AND A SEMICONDUCTOR DEVICE THAT USES SUCH A COMPOSITE SEMICONDUCTOR STRUCTURE

[75] Inventor: Takuma Tsuchiya, Kawasaki, Japan
[73] Assignee: Fujitsu Limited, Kawasaki, Japan
[21] Appl. No.: 206,220
[22] Filed: Mar. 7, 1994

Related U.S. Application Data

[63] Continuation of Ser. No. 924,486, Aug. 4, 1992, abandoned.

[30] Foreign Application Priority Data

Aug. 5, 1991 [JP] Japan ................... 3-195325

[51] Int. Cl.$^5$ ............................................. H01L 27/14
[52] U.S. Cl. ........................................ 257/6; 257/20; 257/21; 257/22; 257/96; 257/194; 257/200; 257/17
[58] Field of Search .................... 257/192, 194, 96, 97, 257/22, 21, 20, 6, 200, 17, 19

[56] References Cited

U.S. PATENT DOCUMENTS

| | | | |
|---|---|---|---|
| 4,163,237 | 7/1979 | Dingle et al. | 257/20 |
| 4,261,771 | 4/1981 | Dingle et al. | 257/22 X |
| 4,620,206 | 10/1986 | Ohta et al. | 357/4 |

FOREIGN PATENT DOCUMENTS

60-175450 9/1985 Japan .
3218078 9/1991 Japan ................... 257/21

OTHER PUBLICATIONS

Mori et al., "Electron–Optical–Phonon Interaction in Single and Double Heterostructures," Physical Review B, vol. 40, No. 9, 15 Sep. 1989, pp. 6175–6188.
Surface Science, vol. 234, 1990, Cambridge, Mass., US, pp. 169–180, L. Colombo et al. "Lattice Dynamics of Homopolar/Heteropolar Semiconductor Superlattices: Ge/GaAs and Ge/AlAs".
Patent Abstracts of Japan, vol. 10, No. 11 (E-374((2068) 17 Jan. 1986.
Applied Physics Letters, vol. 42, No. 5, Mar. 1983, New York, US, pp. 463–465, Chin-an Chang et al. "Channeling Studies of Ga-GaAs Superlattices Grown by Molecular Beam Epitaxy".

*Primary Examiner*—William Mintel
*Attorney, Agent, or Firm*—Staas & Halsey

[57] ABSTRACT

A semiconductor structure comprises a first material layer of a homopolar material having a conduction band that includes an L valley and a Γ valley such that the L valley has an energy level lower than the Γ valley when in a bulk crystal state, and a second material layer of a polar compound formed with an epitaxial relationship with respect to the first material layer; wherein the first material layer has a thickness such that there is formed first and second quantum levels respectively in correspondence to the Γ valley and the L valley such that: the second quantum level has an energy level higher than the first quantum level.

13 Claims, 6 Drawing Sheets

HEMT

MESFET

COMPOSITE SEMICONDUCTOR STRUCTURE FOR REDUCING SCATTERING OF CARRIERS BY OPTICAL PHONONS AND A SEMICONDUCTOR DEVICE THAT USES SUCH A COMPOSITE SEMICONDUCTOR STRUCTURE

This application is a continuation, of application Ser. No. 07/924,486, filed Aug. 4, 1991, now abandoned.

BACKGROUND OF THE INVENTION

The present invention generally relates to semiconductor devices and more particularly to a semiconductor material having a composite structure for reducing the scattering of carriers by optical phonons.

Compound semiconductor materials such as GaAs or a mixed crystal thereof are characterized by the small effective mass and are used extensively in various high-speed semiconductor devices such as HEMT or MESFET. In order to exploit the advantageous property of the compound semiconductor material and to realize much faster devices, intensive and extensive efforts are made worldwide.

On the other hand, these compound semiconductor materials, generally formed of a group 11 or III element and a group V or VI element, are polar compounds in nature and show a polarity in the crystal structure of the material- Associated with the polarity, optical phonons induce a macroscopic electric field, and such a macroscopic electric field tends to cause scattering of carriers when the material is used for an active part of a semiconductor device. This problem of scattering by optical phonons becomes particularly conspicuous in the high-speed devices such as a HEMT where a large acceleration of carriers occurs. When the scattering occurs, the carrier velocity tends to be saturated at a relatively low level because of the scattering by the optical phonons even when there is a large acceleration of carriers in the channel region of the device.

In order to overcome the problem of scattering of carriers by the optical phonons, there is a proposal to sandwich a layer of polar compound semiconductor material by a pair of layers of a homopolar material such that the oscillation of electric field, which is induced by the optical phonons in the compound semiconductor material, is reduced at the homopolar material layer (Mori, N. and Ando, T., Phys. Rev. vol. 40, no.9, pp.6175-6188, 1989). In this prior art reference, the damping rate of poiarons is studied theoretically for a structure wherein an InAs layer is sandwiched by a pair of Ge layers. It was shown that the damping of polarons is substantially reduced in this sandwich structure particularly when the thickness of the InAs layer is reduced, indicating the reduction of carrier scattering by the optical phonons as a result of use of the homopolar material. On the other hand, the sandwich structure of InAs and Ge is a mere hypothetical or theoretical structure that the structure cannot be fabricated actually because of the large discrepancy in the lattice constant between InAs and Ge.

As a combination of the polar material and the homopolar material that satisfies the matching of lattice constant, one can conceive use of a sandwich structure of GaAs and Ge wherein a layer of GaAs is sandwiched by a pair of Ge layers. In this combination of materials, the difference in the lattice constant is within 0.1%. In this sandwich system, however, there arises a problem in that the GaAs layer does not form a potential well but a potential barrier, and carriers are accumulated in the Ge layer instead of the GaAs layer.

FIG. 1 shows the band diagram of the foregoing sandwich structure that includes. A GaAs layer 1 sandwiched by a pair of Ge layers 2 in the thermal equilibrium state. In FIG. 1, the continuous line represents the conduction band for the $\Gamma$ valley while the broken line represents the conduction band for the L valley. As can be seen clearly, the GaAs layer 1 forms a potential barrier with respect to the Ge layer 2, and the electrons are accumulated in the Ge layer 2 rather than in the GaAs layer 1.

FIGS.2(A) and 2(B) are the band diagrams showing the well known band structure of Ge and GaAs respectively. As can be seen in FIG. 2(A), the conduction band of Ge has the lowest energy state at the L valley, and the electrons usually occupy this state. On the other hand, the electrons in this state exhibit a relatively large effective mass ($m^*_1 = 1.6\ m_0$, $m^*_t = 0.082\ m_0$; $m_0$ represents the mass of electrons; $m^*_1$ and $m^*_t$ represent respectively the effective mass in the longitudinal direction and in the lateral direction of the energy ellipsoid that represents the iso-energy surface in the wave vector space), and because this, the Ge crystal cannot transport the electrons at a high speed. On the other hand, there exists another valley designated as $\Gamma$ valley in the conduction band of Ge at an energy level higher than the L valley by about 100 meV. At the $\Gamma$ valley of Ge, it is known that the electrons exhibit a very small effective mass of about $0.042 m_0$, which is even smaller then the effective mass of electrons in the GaAs crystal. On the other hand, the $\Gamma$ valley of Ge is not the stable state and the conventional device could not use this preferable feature of Ge crystal.

In GaAs, on the other hand, the lowest energy state of the conduction band is realized at the $\Gamma$ valley, and the electrons show a very small effective mass of $0.067 m_0$ in correspondence to the $\Gamma$ valley. Because of this advantageous feature, the GaAs crystal has been used extensively in the conventional high speed semiconductor devices. Further, there exists an L valley in the conduction band of GaAs at an energy level higher than the $\Gamma$ valley by about 300 meV.

Referring to the structure of FIG. 1 again, it will be noted that the $\Gamma$ valley of the GaAs layer 1 acts as the potential barrier for the electrons that occupy the $\Gamma$ valley of the Ge layer 2, while the L valley of the GaAs layer 1 acts as the potential barrier for the electrons that occupy the L valley of the Ge layer 2. In such a structure of FIG. 1, one cannot achieve the desired high speed transportation of carriers even when the scattering of the carriers by optical phonons is successfully minimized by the sandwich structure of polar compound and homopolar compound, because of the slow transport of carriers through the Ge layer 2.

SUMMARY OF THE INVENTION

Accordingly, it is a general object of the present invention to provide a novel and useful semiconductor structure for transporting carriers wherein the foregoing problems are eliminated.

Another and more specific object of the present invention is to provide a semiconductor structure for transporting carriers therethrough with a reduced scattering by optical phonons, said semiconductor structure comprising an alternate stacking of a polar compound layer and a homopolar compound layer with a lattice matching established therebetween.

Another object of the present invention is to provide a semiconductor structure for transporting carriers therethrough, comprising an alternate stacking of: a first material layer of a homopolar material, said first material layer having upper and lower major surfaces and having a conduction band characterised by a Γ valley and an L valley such that the L valley has an energy level lower than the Γ valley when in a bulk crystal state, said Γ valley and said L valley providing respective effective masses of carriers such that the effective mass of the carriers in said Γ valley is substantially smaller than the effective mass of the carriers in said L valley; and a second material layer of a polar compound provided on said first material layer, said second material layer having upper and lower major surfaces and having a conduction band characterized by a Γ valley and an L valley such that the Γ valley has an energy level lower than the L valley when in a bulk crystal state, said first material layer and said second material layer being formed with an epitaxial relationship with each other; said first material layer having a thickness such that there is formed a plurality of quantum levels in said first material layer, said plurality of quantum levels include a first quantum level that is the lowest quantum level formed in correspondence to the Γ valley and a second quantum level that is the lowest quantum level formed in correspondence to the L valley, said thickness of said first material layer being set such that said second quantum level has an energy level higher than said first quantum level. According to the present invention, one can effectively minimize the scattering of electrons by the optical phonons by reducing the strength of the macroscopic electric field in the second material layer by means of the first material layer of homopolar compound that induces no macroscopic electric field therein. In addition, one can realize a very fast transport of electrons because of the reduced effective mass in the Γ valley of the homopolar material, particularly when Ge is used for the homopolar material. It should be noted that electrons fall in the L valley of Ge when the Ge crystal is in the bulk state, while when there is a quantum level in the Ge layer with the energetical relationship as set forth above, the electrons occupy the quantum level corresponding to the Γ valley. As the electrons exhibit a very small effective mass both in the Γ valley of Ge and in the Γ valley of GaAs, the problem of slow transport of electrons through the homopolar Ge layer is successfully eliminated. By setting the quantum level corresponding to the Γ valley of the first material layer to be substantially equal to the Γ valley of the polar material that forms the second material layer, the electrons are transported both through the first material layer and through the second material layer with a very high speed. Thus, the structure of the present invention provides a significant improvement of operational speed when used in semiconductor devices. In addition, the composite semiconductor structure of the present invention interacts with optical radiation by the direct transition process. Therefore, the composite semiconductor structure of the present invention is useful also in optical semiconductor devices.

Other objects and further features of the present invention will become apparent from the following detailed description when read in conjunction with the attached drawings.

DETAILED DESCRIPTION OF THE PREFERRED EMBODIMENTS

Figure 1:
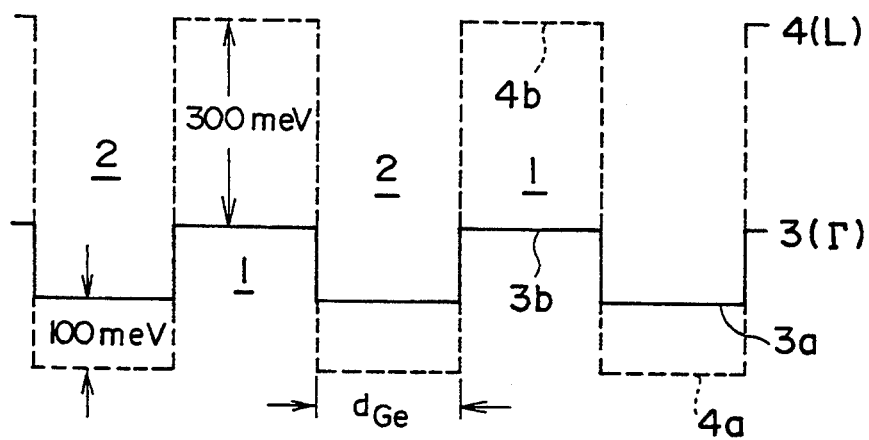
FIG. 1 is a band diagram showing a conventional composite semiconductor structure that includes a GaAs layer sandwiched by a pair of Ge layers.
Figure 2B:
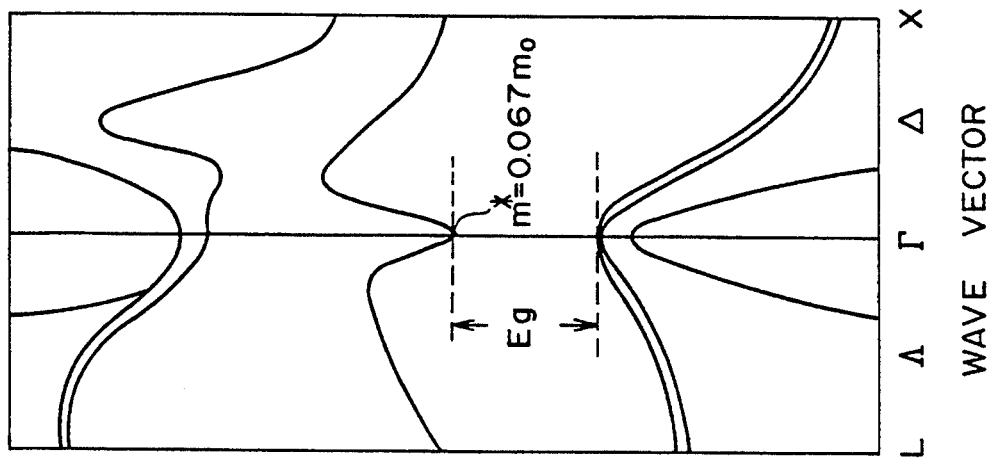
FIGS. 2(A) and 2(B) are diagrams respectively showing the band structure of Ge and GaAs bulk crystals.
Figure 2A:
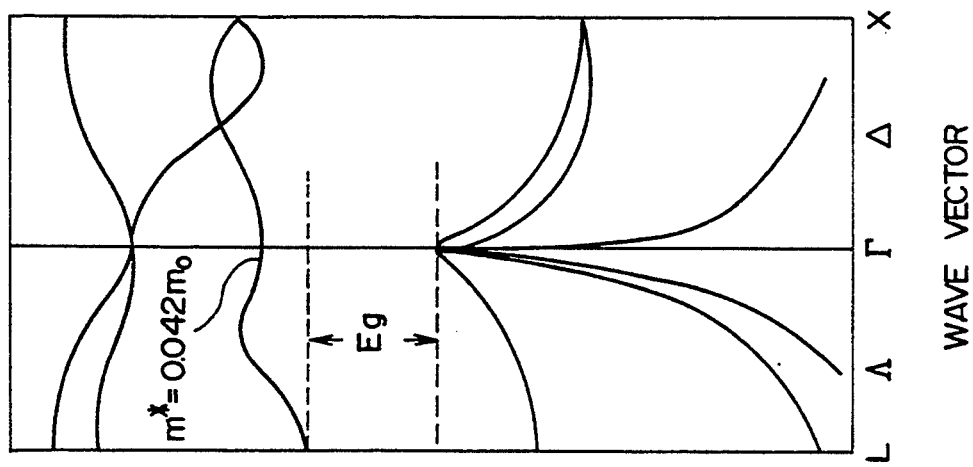
Figure 3:
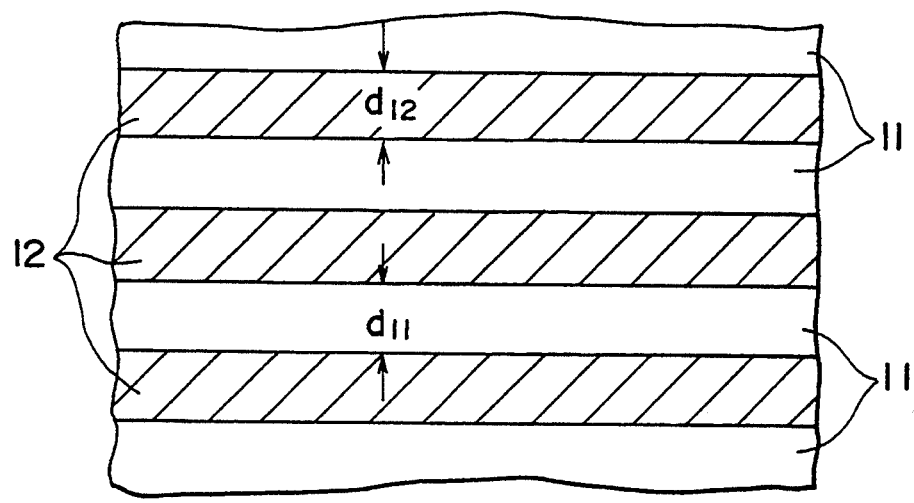
FIG. 3 is a diagram showing a composite semiconductor structure according to a first embodiment of the present invention.

FIG. 3 shows the structure of a composite semiconductor material according to a first embodiment of the present invention.

Figure 4:
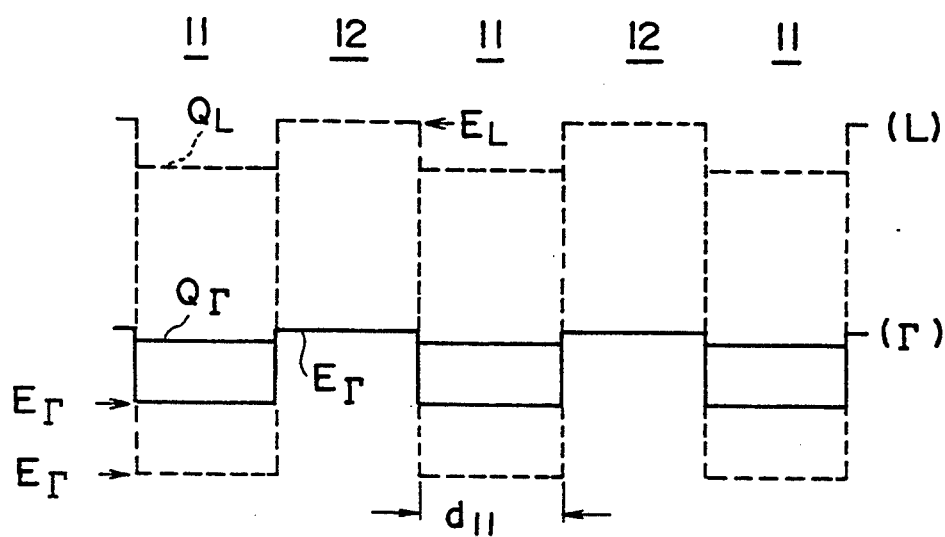
FIG. 4 is a band diagram showing the quantum levels formed in the composite semiconductor structure of FIG. 3.

Referring to FIG. 3, the composite semiconductor material is formed of an alternate and repetitive stacking of a Ge layer 11 and a GaAs layer 12 with respective thicknesses of $d_{11}$ and $d_{12}$. In the present embodiment, the thickness $d_{11}$ and the thickness $d_{12}$ are set substantially equal to each other. The thicknesses $d_{11}$ is set substantially small such that there are formed quantum states $Q_{64}$ and $Q_L$ in the Ge layer 11 as shown in FIG. 4, wherein the quantum state $Q_\Gamma$ and the quantum state $Q_L$ correspond to the Γ valley and L valley of the conduction band of Ge, respectively. There are formed a number of quantum levels in correspondence to the Γ valley and the L valley, wherein those quantum states having the lowest energy level in the Γ valley and in the L valley will be considered in the discussion below.

In the quantum well structure of FIG. 4, it should be noted that the energy levels of the quantum states $Q_\Gamma$ and $Q_L$ are represented as $$E_{Q\Gamma} = E_\Gamma + (h/2\pi)^2/(2m^*_\Gamma)(\pi/d_{11})^2 \quad (1)$$

and $$E_{QL} = E_L + (h/290)^2/(2m^*_\Gamma)(\pi/d_{11})^2, \quad (2)$$

where $E_\Gamma$ and $E_L$ represent respectively the energy level of the Γ valley and the L valley in the conduction band of Ge, while $m^*_G$ and $m^*_L$ represent the effective mass of electrons respectively in the Γ valley and in the L valley of Ge. Here, the effective mass $m^*_L$ represents the value of the effective mass in the direction perpendicular to the interface between the layer 11 and the layer 12. In Eqs.(1) and (2), the spreading of the electron wavefunction into the adjacent GaAs layer 12 is neglected. In other words, Eqs.(1) and (2) assumes an ideal confinement of electrons in the quantum well layer 1.

Referring to Eqs.(1) and (2), it will be noted that the energy level of the quantum state $Q_\Gamma$ and $Q_L$ increases with decreasing thickness $d_{11}$ as usual in the quantum well structure. Here, it should be noted that the effective mass $m^*_\Gamma$ in the $\Gamma$ valley is much smaller than the effective mass $m^*_L$ in the L valley in the system of FIG. 4. Associated therewith, the energy level of the quantum state $Q_\Gamma$ increases with a rate larger than the rate of increase of the energy level of the quantum state $Q_L$. On the other hand, the energy level of the quantum state $Q_\Gamma$ cannot exceed the energy level $E_\Gamma$ of the $\Gamma$ valley for the layer 12 that acts as the potential barrier. Above the energy level of the $\Gamma$ valley of the layer 12, no confinement of carrier occurs and hence there appear no quantum levels. The rapid increase of the energy level of the quantum state $Q_L$ means that there occurs an inversion in the relationship between the energy level of the quantum state $Q_\Gamma$ and the energy level of the quantum state $Q_L$ with decreasing thickness $d_{11}$, such that the energy level of the quantum state $Q_L$, which represents the lowest energy state in the bulk Ge crystal, exceeds the energy level of the quantum state $Q_\Gamma$ in the quantum well structure.

In the system of FIG. 3 that employs the quantum well structure for the Ge layer 11, it should be noted that the thickness $d_{11}$ is set such that the quantum state $Q_L$ exceeds the quantum state $Q_\Gamma$. In the illustrated example, the thickness $d_{11}$ is set to about 20 Å. As a result, the quantum state $Q_\Gamma$ becomes the lowest state and the electrons occupy the quantum state $Q_\Gamma$ where the effective mass of electrons is extremely small. Thereby, the electrons are transported both along the quantum well layer 11 and the barrier layer 12 at a high speed. Further, such a structure is effective for reducing the macroscopic electric field in the GaAs layer 12.

Figure 5:
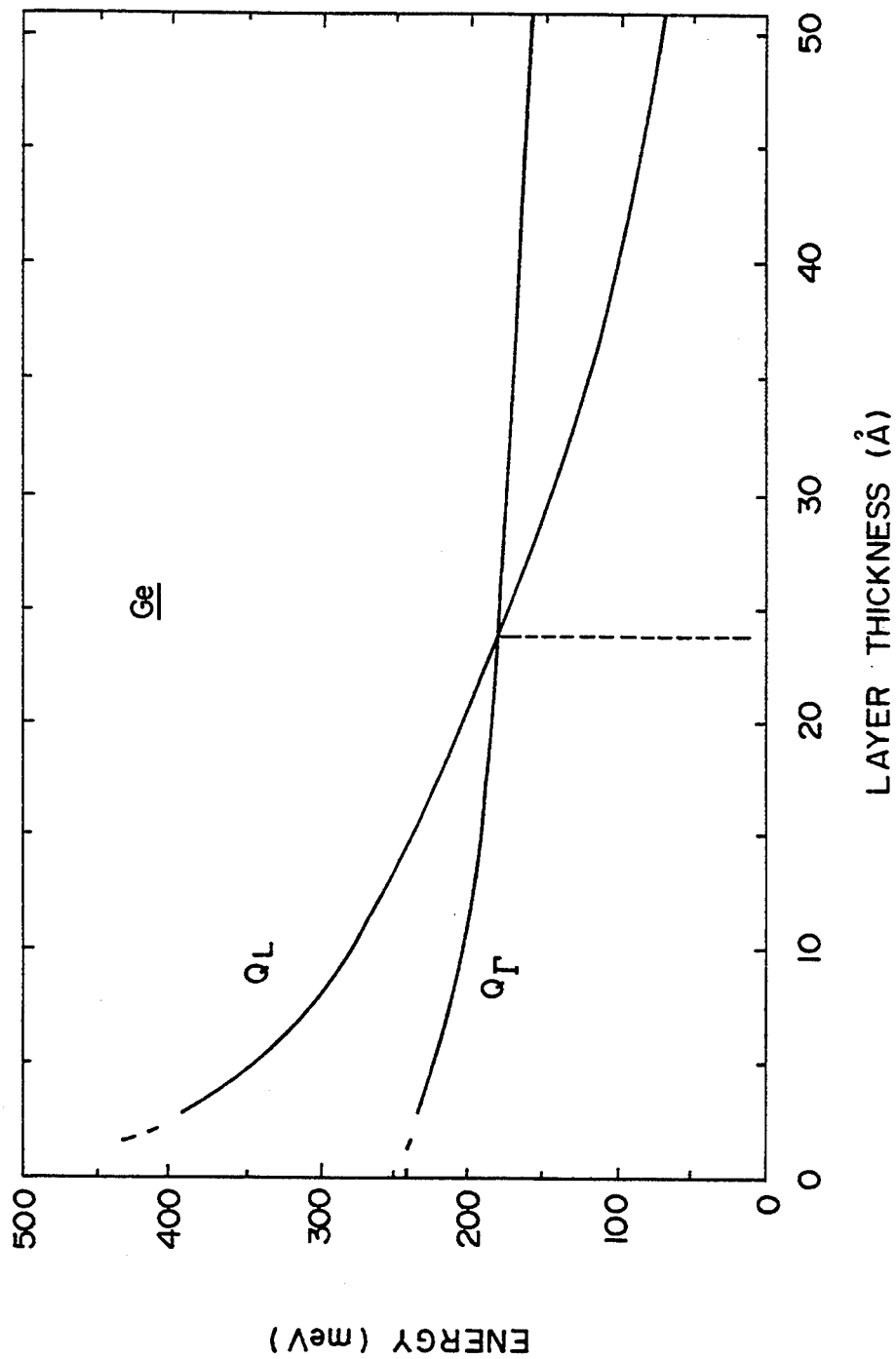
FIG. 5 is a diagram showing the energy level of quantum states formed in the Ge quantum weal layer as a function of the thickness of the quantum well.

FIG. 5 shows the energy level of the quantum states $Q_L$ and $Q_\Gamma$ as a function of the thickness $d_{11}$ of the layer 11. As will be noted in FIG. 5, the energy level of the quantum state $Q_L$ increases steadily with a substantial rate with decreasing thickness $d_{11}$ of the layer 11, while the energy level of the quantum state $Q_\Gamma$ increases with a rate that is much smaller than the quantum level $Q_L$ in conformity with the qualitative argument as set forth above with reference to Eqs.(1) and (2). Thereby, the energy level of the quantum state $Q_L$ exceeds the energy level of the quantum state $Q_\Gamma$ at the thickness $d_{11}$ of about 23 Å. In other words, the quantum state $Q_L$ becomes the ground state when the thickness $d_{11}$ is reduced below about 23 Å, contrary to the band structure of the bulk Ge crystal. When the thickness $d_{11}$ decreases excessively and the quantum level $Q_\Gamma$ approaches the band edge $E_\Gamma$ of the GaAs layer 12, the effect of confinement of electrons in the quantum well layer 11 decreases and the wavefunction electrons tend to spread into the GaAs layer 12. Thereby, the rate of increase of the quantum level $Q_\Gamma$ with decreasing thickness $d_{11}$ becomes substantially zero. It should be noted, however, that the foregoing threshold thickness of 23 Å is not completely established but may change depending on the calculation or experiment. At the outset, one may safely conclude that the quantum state $Q_L$ exceeds the quantum state $Q_\Gamma$ at about 30 Å for the thickness $d_{11}$ of the layer 11.

Figure 6:
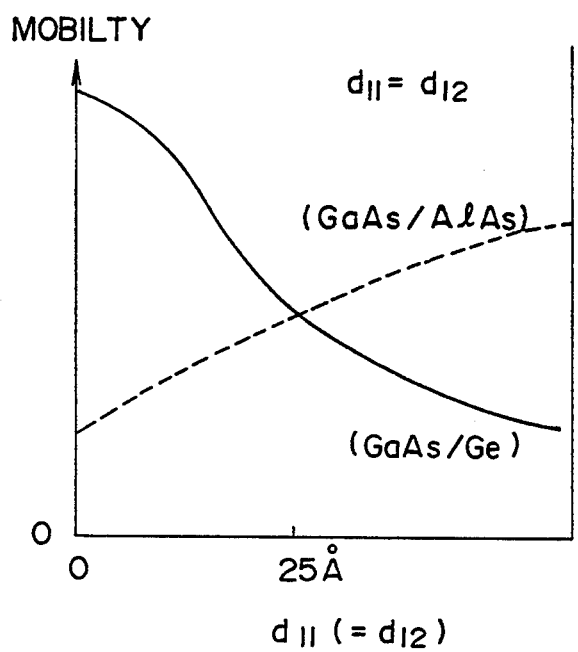
FIG. 6 is a diagram showing the mobility of electrons in the composite semiconductor structure of FIG. 3 as a function of the thickness of the quantum well layer.

FIG. 6 shows the relationship between the mobility in the system of FIG. 3 as a function of the thickness $d_{11}$, wherein the continuous line represents the result for the sandwich structure of Ge and GaAs, while the broken line shows, as a reference, the result for an alternate stacking structure of GaAs and AlAs. Here, the thickness $d_{12}$ of the layer 12 is changed while maintaining the relationship of $d_{12}=d_{11}$. As can be seen clearly in FIG. 6, the mobility of the electrons increases particularly when the thickness $d_{11}$ (and hence $d_{12}$) is reduced below about 25 Å. On the other hand, the mobility decreases in the stacking structure of GaAs and AlAs when the thickness is reduced.

When the thickness $d_{12}$ for the GaAs layer 12 is reduced excessively, on the other hand, there arises a problem of spreading of the wavefunction of electrons into the GaAs layer 12. In such a case, the optimum thickness $d_{12}$ of the GaAs layer 12 may be different from the thickness $d_{11}$ of the Ge layer 11. The following TABLE I shows some of the examples of the thicknesses $d_{11}$ and $d_{12}$.

TABLE I

OPTIMUM RELATIONSHIP BETWEEN THE THICKNESS OF THE Ge LAYER AND THE GaAs LAYER IN THE STRUCTURE OF FIG. 3 IN THE RANGE OF REDUCED LAYER THICKNESS

| $d_{11}$(Å) | $d_{12}$(Å) |
|---|---|
| 25 | 25 |
| 17 | 8.5 |
| 8.5 | 5.5 |

Summarizing the above, one can minimize the scattering of the electrons by optical phonons by using the sandwich structure of FIG. 3 wherein the Ge layer 11 is sandwiched by a pair of GaAs layers. By setting the thickness $d_{11}$ of the Ge layer 11 such that the quantum state $Q_\Gamma$ is formed below the quantum state $Q_L$, one can achieve an extremely fast transport of electrons through the structure of FIG. 3 due to the extremely small effective mass of electrons in the quantum state $Q_\Gamma$. By using the composite semiconductor structure of FIG. 3 for the channel layer of high speed semiconductor devices, one can realize a very fast transport velocity of carriers even in the room temperature environment.

The material for the quantum layer 11 is of course not limited to Ge but may be any homopolar semiconductor material having a band structure similar to Ge. Further, the quantum well. Layer 11 of the structure of FIG. 3 is not necessarily be pure Ge but may contain impurities such as B, Al, Ga, In, P, As, Sb, etc., such that the layer 11 is doped to a desired conductivity type with a desired impurity concentration level. In correspondence to this;, the GaAs layer 12 may be doped by the impurity elements such as Zn, Si, etc. In addition, the layer 11 may be a mixed crystal of Ge and Si. As the electrons occupy the $\Gamma$ valley of the Ge layer 11, the composite material of FIG. 3 shows an interaction with light even when Ge is used in the structure. Thus, the structure of FIG. 3 is useful not only in the high speed semiconductor devices but also in the optical semiconductor devices that require the direct transitional type band structure. Further, it should be noted that the material for the layer 12 is not limited to GaAs but other compound semiconductor material such as InGaAs may be employed.

Figure 7:
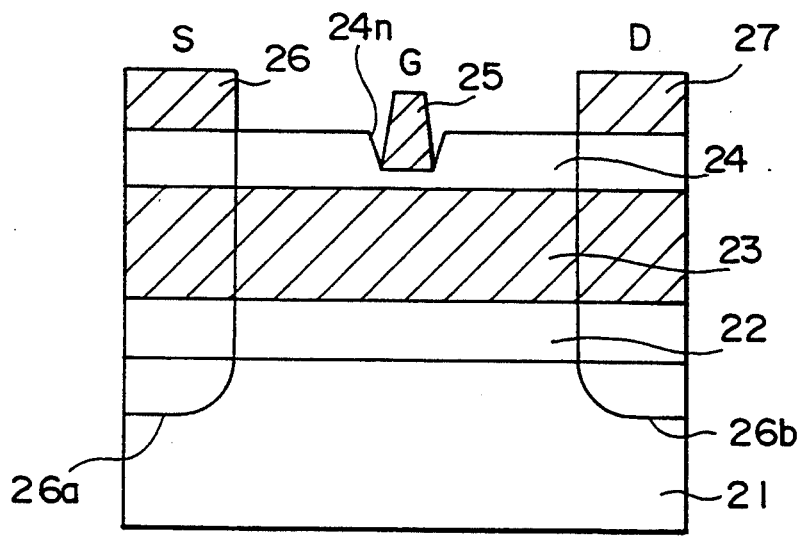
FIG. 7 is a diagram showing the structure of a HEMT according to a second embodiment of the present invention.

FIG. 7 shows the structure of a HEMT according to a second embodiment of the present invention wherein the composite semiconductor material of FIG. 3 is used for the channel layer of the device.

Referring to FIG. 7, the HEMT is constructed on a semi-insulating GaAs substrate 21 and includes an undoped epitaxial buffer layer 22 of a large band gap material such as AlGaAs for preventing the electrons from escaping to the substrate 2].. On the buffer layer 22, there is provided a superlattice structure 23 having a construction shown in FIG. 3 such that the Ge layer 11 and the GaAs layer 12 are stacked alternately while maintaining an epitaxial relationship with the substrate 21. There, each of the layers 11 and 12 has upper and lower major surfaces extending parallel with the upper major surface of the butter layer 22 and transports therethrough the electrons at a very high speed with little scattering by optical phonons. Typically, the structure 23 is formed with a thickness of about 150 Å.

On the upper major surface of the supperlattice structure 23, an n-type electron supplying layer 24 of AlGaAs is grown epitaxially such that there is formed a quasi two-dimensional electron gas filling the superlattice structure 23. On the upper major surface of the electron supplying layer 24, there is provided a recess 24a and a gate electrode 25 is provided on the layer 24 in correspondence to the recess 24a in Schottky contact therewith. Further, n+ type diffusion regions 26a and 26b are formed at both sides of the gate electrode 25, and a source electrode 26 and a drain electrode 27 are provided respectively in correspondence to the diffusion regions 26a and 26b in ohmic contact therewith. As is well known in HEMT, one can adjust the threshold voltage of the device by setting the depth of recess 24a appropriately.

In the HEMT of FIG. 7, one can obtain a very large electron velocity under the gate electrode 25 by reducing the gate length while without being affected by the scattering by the optical phonons. In other words, the HEMT of FIG. 7 can achieve a superior performance even in the room temperature environment.

Figure 8:
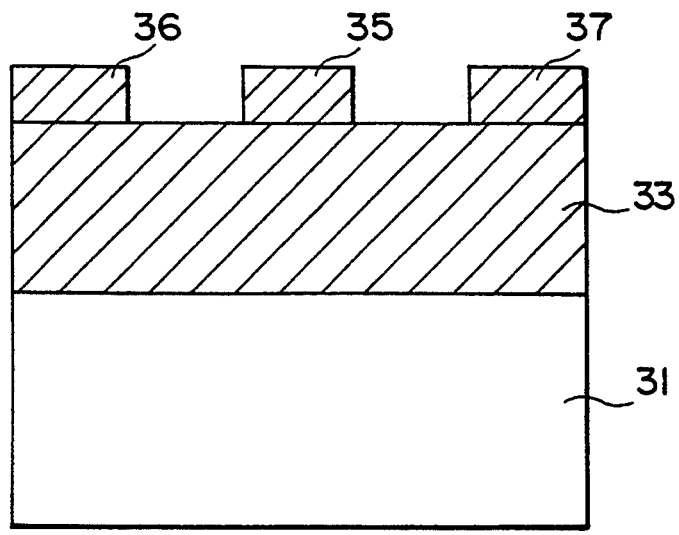
FIG. 8 is a diagram showing the structure of a MESFET according to a third embodiment of the present invention.

FIG. 8 shows a MESFET according to a third embodiment of the present invention wherein the composite semiconductor material of FIG. 3 is used for the channel layer, similarly to the HEMT of FIG. 7.

Referring to FIG. 8, the MESFET is constructed on a semi-insulating GaAs substrate 31 corresponding to the substrate 21, and a channel layer 33, doped to the n-type and having the composite semiconductor structure of FIG. 3, is provided on the substrate 31. On the upper major surface of the channel layer 33, there is provided a gate electrode 35 in Schottky contact therewith, and ohmic electrodes 36 and 37 are provided as the source and the drain of the device at both sides of the gate electrode 35. In this device, too, one obtains a very fast transport of carriers through the channel layer without substantial scattering by the optical phonons.

Figure 9:
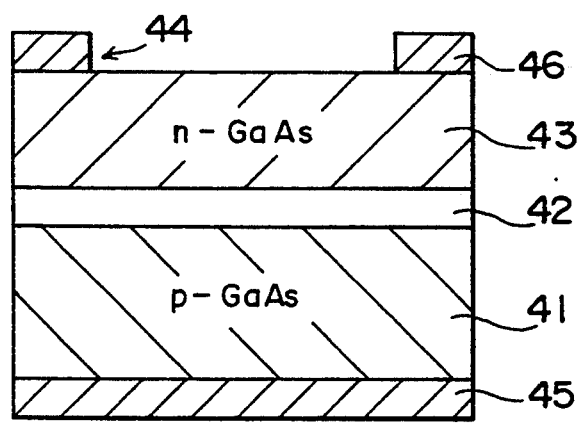
FIG. 9 is a diagram showing the structure of an optical semiconductor device according to a fourth embodiment of the present invention.

FIG. 9 shows an LED according to a fourth embodiment that uses a direct transition of carriers occurring in the composite semiconductor structure of FIG. 3 for producing optical radiation.

Referring to FIG. 9, the device is constructed on a p-type GaAs crystal layer 41, and a layer 42 corresponding to the composite semiconductor structure of FIG. 3 is formed epitaxially on the layer 41 with a total thickness of 100 Å. On the layer 42, there is provided an n-type GaAs epitaxially, and an ohmic electrode 45 is provided to cover the lower major surface of the GaAs layer 41. Further, on the upper major surface of the GaAs layer 43, there is provided a ring-shaped ohmic electrode 46 formed with a passage or window 44 of optical beam such that the optical beam can exit freely from the device.

In operation, a forward bias voltage is applied across the electrodes 46 and 45 for injecting electrons and holes into the layer 42 of the composite semiconductor structure, and optical radiation is formed as a result of recombination of the electrons and holes. In the layer 42, it should be noted that the recombination of carriers occurs not only in the GaAs layer 12 but also in the Ge layer 12 because of the quantum well structure as explained previously. Thus, the composite semiconductor structure of the present invention is not only useful in the high-speed semiconductor devices but also in the optical semiconductor devices.

It should be noted that the structure of the first through fourth embodiments of the present invention can be fabricated easily by the MBE process or MOCVD process with excellent control of the layer thickness.

Further, the present invention is not limited to the embodiments described heretofore, but various variations and modifications may be made without departing from the scope of the invention.

What is claimed is:

1. A semiconductor structure for transporting carriers therethrough, comprising an alternate stacking of:
   a first material layer of a homopolar material, said first material layer having upper and lower major surfaces and having a conduction band characterized by a Γ valley and an L valley such that the L valley has an energy level lower than the Γ valley when in a bulk crystal state, said Γ valley and said L valley providing respective effective masses of carrier such that the effective mass of the carriers in said Γ valley is substantially smaller than the effective mass of the carriers in said L valley; and
   a second material layer of a polar compound provided on said first material layer, said second material layer having upper and lower major surfaces and having a conduction band characterized by a Γ valley and an L valley such that the Γ valley has an energy level lower than the L valley when in a bulk crystal state, said first material layer and said second material layer having respective lattice constants such that said first material layer and said second material layer are formed with an epitaxial relationship with each other;
   said first material layer having a thickness such that there is formed a plurality of quantum levels in said first material layer, said plurality of quantum levels include a first quantum level that is the lowest quantum level formed in correspondence to the Γ valley and a second quantum level that is the lowest quantum level formed in correspondence to the L valley, said thickness of said first material layer being set smaller than 23 Å such that said quantum level has an energy level higher than said first quantum level.

2. A semiconductor structure as claimed in claim 1 in which said homopolar material contains therein Ge as a predominant element.

3. A semiconductor structure as claimed in claim 2 in which said homopolar material contains Si in addition to Ge.

4. A semiconductor structure as claimed in claim 2 in which said homopolar material is doped by an impurity element.

5. A semiconductor structure as claimed in claim 4 in which said thickness of said first material layer is set to about 20 Å.

6. A semiconductor structure as claimed in claim 1 in which said second material layer has a thickness set substantially equal to said thickness of said first material layer.

7. A semiconductor structure as claimed in claim 2 in which said second material layer comprises a group III–V compound semiconductor material.

8. A semiconductor structure as claimed in claim 7 in which said second material layer comprises GaAs.

9. A semiconductor structure as claimed in claim 7 in which said second material layer comprises InGaAs with a composition set to establish a lattice matching with said first material layer.

10. An active semiconductor device, comprising:
a carrier transport means for transporting carriers therethrough, said carrier transport means comprising a channel layer having upper and lower major surfaces, said channel layer comprising a repeating and alternating stacking of:
a first material layer of a homopolar material, said first material layer having upper and lower major surfaces and having a conduction band characterized by a $\Gamma$ valley and an L valley such that the L valley has an energy level lower than the $\Gamma$ valley when in a bulk crystal state, said $\Gamma$ valley and said L valley providing respective effective masses of carriers such that the effective mass of the carriers in said $\Gamma$ valley is substantially smaller than the effective mass of the carriers in said L valley; and
a second material layer of a polar compound provided on said first material layer, said second material layer having upper and lower major surfaces and having a conduction band characterized by a $\Gamma$ valley and an L valley such that the $\Gamma$ valley has an energy level lower than the L valley when in a bulk crystal state, said first material layer and said second material layer being formed with an epitaxial relationship with each other;
said first material layer having a thickness such that there is formed a plurality of quantum levels in said first material layer, said plurality of quantum levels includes a first quantum level that is the lowest quantum level formed in correspondence to the $\Gamma$ valley and a second quantum level that is the lowest quantum level formed in correspondence to the L valley, said thickness of said first material layer being set such that said second quantum level has an energy level higher than said first quantum level; and
source electrode means provided on said carrier transport means for injecting carriers thereto;
drain electrode means provided on said carrier transport means for collecting carriers therefrom; and
gate electrode means provided on said carrier transport means for controlling a transport of said carriers through said channel layer.

11. A semiconductor device as claimed in claim 10 in which said source electrode means and said drain electrode means comprise an ohmic electrode for establishing an ohmic contact with said upper major surface of said channel layer; while said gate electrode means comprises a Schottky electrode for establishing a Schottky contact with said upper major surface of said channel layer.

12. A semiconductor device as claimed in claim 10 in which said carrier transport means further comprises a doped semiconductor layer on said upper major surface of said channel layer for supplying carriers thereto to form a carrier gas in said channel layer.

13. An optical semiconductor device for interacting with optical radiation, comprising:
an active layer having upper and lower major surfaces, said active layer causing an interaction with optical radiation and comprising a repeating and alternating stacking of:
a first material layer of a homopolar material, said first material layer having upper and lower major surfaces and having a conduction band characterized by a $\Gamma$ valley and an L valley such that the L valley has an energy level lower than the $\Gamma$ valley when in a bulk crystal state, said $\Gamma$ valley and said L valley providing respective effective masses of carriers such that the effective mass of the carriers in said $\Gamma$ valley is substantially smaller than the effective mass of the carriers in said L valley; and
a second material layer of a polar compound provided on said first material layer, said second material layer having upper and lower major surfaces and having a conduction band characterized by a $\Gamma$ valley and an L valley such that the $\Gamma$ valley has an energy level lower than the L valley when in a bulk crystal state, said first material layer and said second material layer being formed with an epitaxial relationship with each other;
said first material layer having a thickness such that there is formed a plurality of quantum levels in said first material layer, said plurality of quantum levels includes a first quantum level that is the lowest quantum level formed in correspondence to the $\Gamma$ valley and a second quantum level that is the lowest quantum level formed in correspondence to the L valley, said thickness of said first material layer being set such that said second quantum level has an energy level higher than said first quantum level;
a first semiconductor layer having upper and lower major surfaces and provided below said lower major surface of said active layer, said first semiconductor layer being doped to a first conductivity type;
a second semiconductor layer having upper and lower major surfaces and provided above said upper major surface of said active layer, said second semiconductor layer being doped to a second, opposite conductivity type;
a first electrode provided on said lower major surface of said first semiconductor layer; and
a second electrode provided on said upper major surface of said second semiconductor layer, said second electrode being provided with a window for exposing the upper major surface of the second semiconductor layer such that optical radiation passes through said window freely.

* * * * *

UNITED STATES PATENT AND TRADEMARK OFFICE
CERTIFICATE OF CORRECTION

PATENT NO. : 5,336,901
DATED : August 9, 1994
INVENTOR(S) : TAKUMA TSUCHIYA

Page 1 of 2

It is certified that error appears in the above-indentified patent and that said Letters Patent is hereby corrected as shown below:

Abstract [57], line 10, delete ":"

Column 1, line 9, delete "1991" and substitute --1992--;

line 28, delete "material-" and substitute --material.--;

line 49, delete "poiarons" and substitute --polarons--.

Column 2, line 4, delete "includes. A" and substitute --includes a--.

Column 4, line 15, delete "weal" and substitute --well--;

line 40, delete "thicknesses" and substitute --thickness--;

line 42, delete "$Q_{64}$" and substitute --$Q_{\%}$--;

line 58, delete "290" and substitute --$2\pi$--.

Column 5, line 7, delete "-" and substitute --.--;

line 45, after "$Q_L$" and insert --,--.

UNITED STATES PATENT AND TRADEMARK OFFICE
CERTIFICATE OF CORRECTION

PATENT NO. : 5,336,901

DATED : August 9, 1994

INVENTOR(S) : TAKUMA TSUCHIYA

It is certified that error appears in the above-indentified patent and that said Letters Patent is hereby corrected as shown below:

Column 6, line 47, change "well. Layer" to --well layer--;

line 51, delete "this;," and substitute --this,--.

Column 7, line 5, delete "2].." and substitute --21--.

line 16, delete "supperlattice" and susbtitute --superlattice--.

Signed and Sealed this

Twenty-ninth Day of November, 1994

Attest:

BRUCE LEHMAN

Attesting Officer

Commissioner of Patents and Trademarks